United States Patent
Yamamoto

(10) Patent No.: US 6,800,838 B2
(45) Date of Patent: Oct. 5, 2004

(54) IMAGE SENSOR HAVING REDUCED STRESS COLOR FILTERS AND METHOD OF MAKING

(75) Inventor: Katsumi Yamamoto, Shanghai (CN)

(73) Assignee: OmniVision International Holding Ltd, Cayman Islands (KN)

( * ) Notice: Subject to any disclaimer, the term of this patent is extended or adjusted under 35 U.S.C. 154(b) by 202 days.

(21) Appl. No.: 10/280,396

(22) Filed: Oct. 25, 2002

(65) Prior Publication Data

US 2004/0080007 A1 Apr. 29, 2004

(51) Int. Cl.[7] .................................................. H01J 40/14
(52) U.S. Cl. ............................... 250/214 R; 250/214.1; 257/432; 438/70
(58) Field of Search ........................... 250/208.1, 214.1; 257/432, 435, 440; 438/70; 349/106; 430/7

(56) References Cited

U.S. PATENT DOCUMENTS

| | | | |
|---|---|---|---|
| 5,708,264 A | * 1/1998 | Hawkins et al. | 250/226 |
| 6,111,247 A | * 8/2000 | Sengupta | 250/226 |
| 6,242,730 B1 | * 6/2001 | Lin et al. | 250/208.1 |
| 6,261,861 B1 | 7/2001 | Pai et al. | |
| 6,274,917 B1 | 8/2001 | Fan et al. | |
| 6,297,071 B1 | * 10/2001 | Wake | 438/70 |
| 6,362,513 B2 | 3/2002 | Wester | |
| 6,436,851 B1 | 8/2002 | Young et al. | |
| 6,699,729 B1 | * 3/2004 | Yamamoto | 438/70 |

* cited by examiner

*Primary Examiner*—Stephone B. Allen
*Assistant Examiner*—Patrick J. Lee
(74) *Attorney, Agent, or Firm*—Perkins Coie LLP

(57) ABSTRACT

A method of forming a base for a color filter layer of an image sensor is disclosed. The image sensor includes an array of pixels formed in a substrate. The method comprises depositing a polymer layer over the substrate. The polymer layer is patterned to form gaps in the polymer layer, the gaps located between the pixels. Finally, a second polymer layer is deposited into the gaps.

16 Claims, 5 Drawing Sheets

IMAGE SENSOR HAVING REDUCED STRESS COLOR FILTERS AND METHOD OF MAKING

TECHNICAL FIELD

The present invention relates to image sensors, and more particularly, towards color filter structure having reduced stress.

BACKGROUND

Image sensors are electronic integrated circuits that can be used to produce still or video images. Solid state image sensors can be either of the charge coupled device (CCD) type or the complimentary metal oxide semiconductor (CMOS) type. In either type of image sensor, a light gathering pixel is formed in a substrate and arranged in a two-dimensional array. Modern image sensors typically contain millions of pixels to provide a high resolution image. An important part of the image sensor are the color filters and micro-lens structures formed atop of the pixels. The color filters, as the name implies, are operative, in conjunction with signal processing, to provide a color image. The micro-lenses serve to focus the incident light onto the pixels, and thus to improve the fill factor of each pixel.

While the technology underlying the formation of color filters is relatively mature, there are still issues that may arise, particularly at higher integration densities. For example, U.S. Pat. Nos. 6,297,071, 6,362,513, and 6,271,900 show the current state of the color filter art. In the prior art, the color filter is typically formed from an organic material. It has been observed that when the color filter is formed atop of the substrate containing the pixel, physical cracking of the substrate may occur. It is believed that the interface of the organic color filter with the substrate causes stress, which in turn results in cracking.

The cracking of the substrate is undesirable insofar as it may cause defects in the image sensor.

DETAILED DESCRIPTION

The present invention relates to a method for forming a color filter layer used in an image sensor. In the following description, numerous specific details are provided to provide a thorough understanding of the embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout the specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
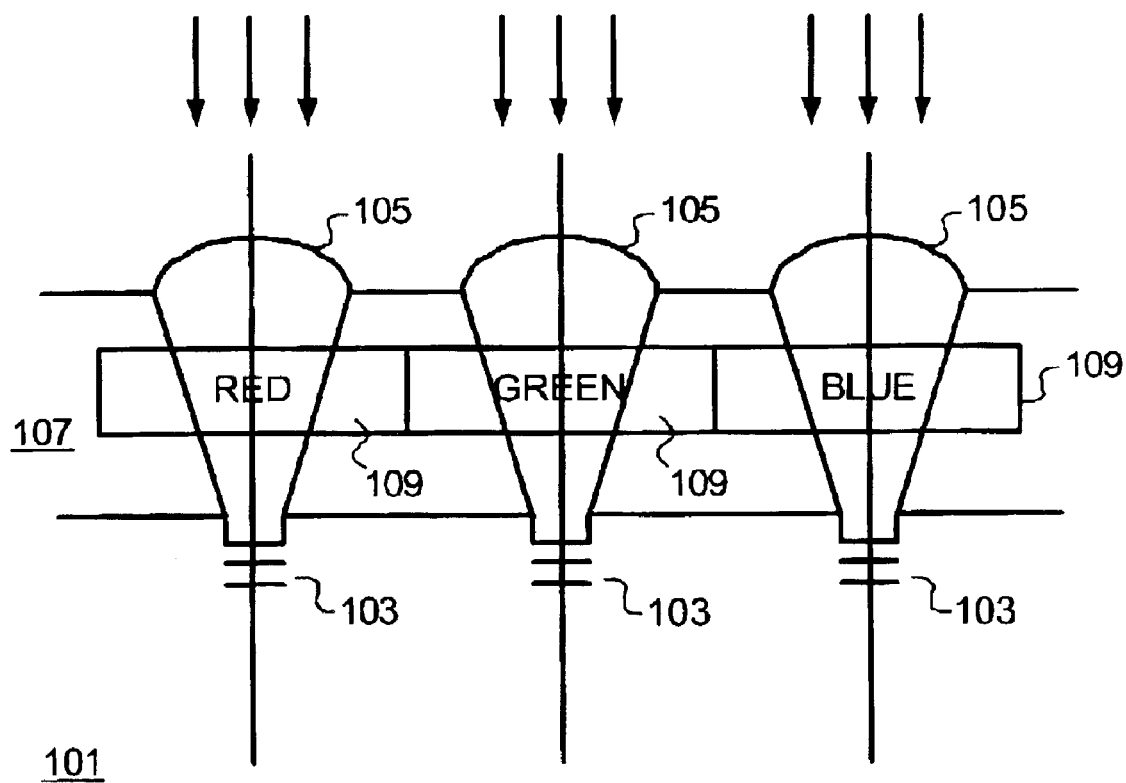
FIG. 1 is a prior art cross sectional view of a portion of an image sensor.

FIG. 1 shows a prior art cross-sectional simplified diagram of an image sensor 101 having micro-lenses formed thereon. As seen in FIG. 1, the image sensor includes a plurality of pixels that have light detecting elements 103 formed in the substrate. The light detecting elements 103 may be one of several types, such as a photodiode, a photogate, or other solid state light sensitive element. Formed atop of each pixel is a micro-lens 105. The micro-lens 105 focuses incident light onto the light detecting elements 103. Micro-lenses are often formed by spin coating a layer of micro-lens material onto a planarized layer. The micro-lens material is then etched to form cylindrical or other shaped regions that are centered above each pixel. Then, the micro-lens material is heated and reflowed to form a convex hemispherical micro-lens. Moreover, in the region between the light detecting elements 103 and the micro-lens 105, denoted by reference numeral 107, there are various intervening layers that would typically include the color filter layers 109 and various metal conducting lines. It can be appreciated that the structure of FIG. 1 is merely one example of an image sensor structure and that the present invention is adaptable to any number of variants. Alternatively, the color filters 109 may be formed atop of the micro-lenses 105.

The color filters 109 are typically a pigmented or dyed material that will only allow a narrow band of light to pass therethrough, for example, red, blue, or green. In other embodiments, the color filter may be cyan, yellow, or magenta. These are but example colors for the color filters 109. While the use of pigmented or dyed color materials is the most prevalent form of color filters, other reflective type color filters may be used, such as a multilayer stack reflective material. The formation of color filters 109 is known in art and will not be described herein to avoid any unnecessary obscuration with the description of the present invention.

Figure 2:
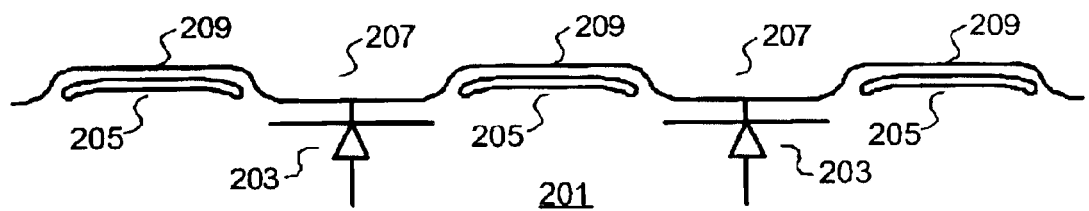
FIGS. 2–6 are schematic cross-sections illustrating the method and structure of one embodiment of the present invention.

The present invention is directed towards the process of preparing (by deposition of stress relieving layers) the substrate prior to forming the color filters 109. FIG. 2 shows a typical wafer substrate 201 that has pixels formed therein. The pixels include light detecting elements 203, which in this case are photodiodes. However, it can be appreciated that other types of light detecting elements, now known (such as a photogate) or developed in the future, may be used. Further, the pixels will typically also include amplification and/or readout circuitry. For clarity, this circuitry is not shown in FIG. 2. In one embodiment, the pixels may be active pixels, commonly known in the prior art. Details of forming the photodiode and other associated circuitry are known in the prior art and will not be repeated herein to avoid obscuring the present invention. Examples of the prior art may be seen in U.S. Pat. Nos. 5,904,493, and 6,320,617.

Moreover, other structures are present in the substrate 201. One example are conductive structures 205 are polysilicon or metallic interconnects, such as those used to carry signals to or from the light detecting elements 203 or to or from other components in the pixels. Because these conductive structures 205 are usually formed atop of the substrate 201, this causes an uneven topography characterized by valleys 207 and ridges 209. Further, there is a need to insulate these conductive structures with an insulating dielectric. Typically, the insulating dielectric is an inorganic material, such as silicon dioxide or a nitride. As noted above, the interface between the organic color filter material and the inorganic substrate material may cause stress and cracking.

Figure 3:
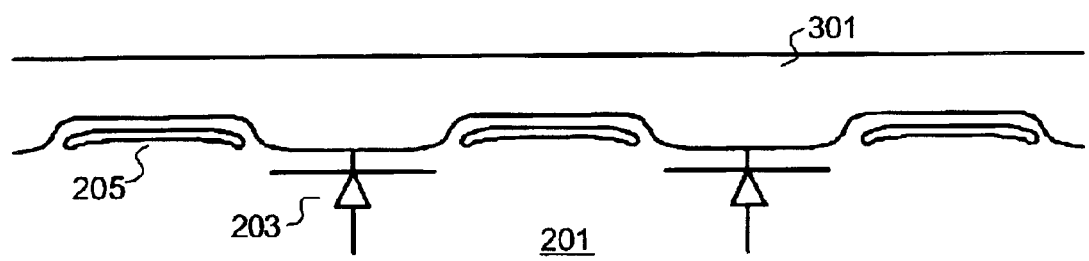

Turning to FIG. 3, according to one embodiment of the present invention, a polymer layer 301 is spin coated over the substrate 301. The polymer layer 301 in one embodiment is polyglycidylmethylacrylate (PGMA). In one embodiment, the polymer layer 301 is between 0.01 to 0.5 microns. However, other types of materials may be substituted, but preferably materials that may be spun on and subsequently cured into a solid.

Figure 4:
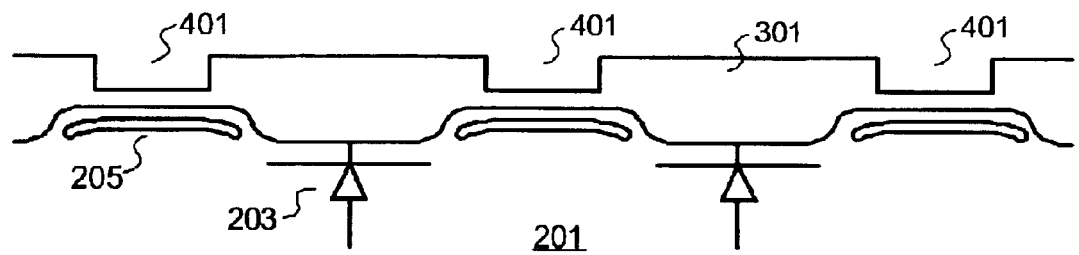

As will be seen below with respect to FIG. 4, the photoresist-type materials are advantageous in one embodiment since they can be directly patterned by exposure and development. Non-photoresist type materials, while still capable, would require a further etching step. Specifically, as seen in FIG. 4, the polymer layer 301 is patterned to include gaps 401 between each pixel. The gaps 401 are generally located between the light detecting elements 203 and are relatively narrow. Note that the illustration of FIG. 4 is not drawn to scale. Instead, the gaps 401 are generally significantly less in width than the width of each pixel. In some embodiments, the gaps are made to be very small relative to the pixel dimension, and perhaps even to the limit of resolution of the photolithography process.

Figure 7:
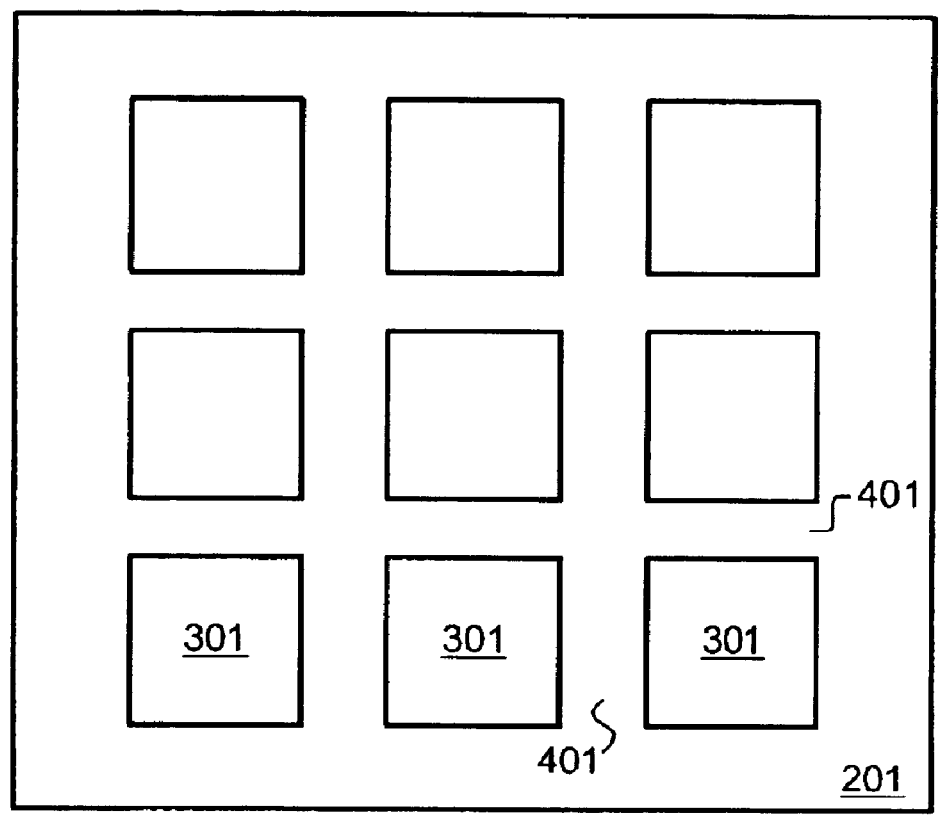
FIG. 7 is a top view of the structure of FIG. 4.

Moreover, in one embodiment, the gaps 401 form a trench that surrounds each pixel. This can be more clearly seen in FIG. 7, where the polymer layer 31 form "islands" over the light detecting elements 203. The gaps 401 extend around the periphery of the pixels.

Note also, that in one embodiment, the gaps 401 do not extend through the entire thickness of the polymer layer 301. Instead, there remains a portion of the polymer layer 301 at the bottom of the gaps 401. Typically, the gaps 401 would extend to nearly the underlying substrate. However, in other embodiments, the gaps 401 may extend completely through the polymer layer 301.

In the case of a photoresist-type material, the patterning of the polymer layer 301 with the gaps 401 may be accomplished by exposing the polymer layer 301 to an exposing radiation from, for example, a stepper machine. Then, the polymer layer 301 can be developed to form the gaps 401. In the case of a non-photoresist type material, the patterning of the polymer layer 301 may require the use of various masking and etching techniques.

Figure 5:
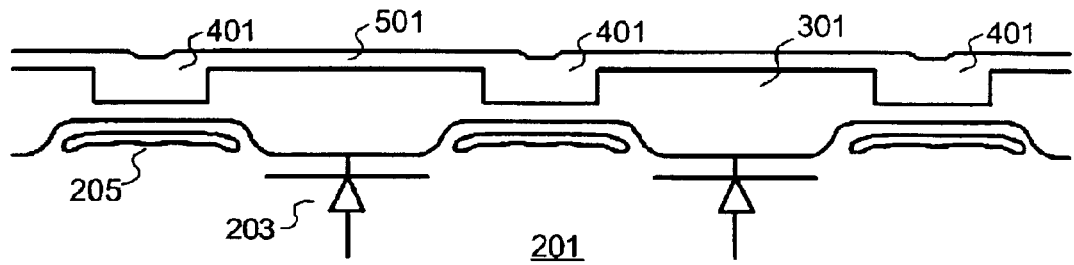

Turning to FIG. 5, after the gaps 401 have been formed, a second polymer layer 501 is applied into the gaps 401 and over the polymer layer 301. The second polymer layer 501 in one embodiment is an organic polyimide, such as poly-methylmethylacrylate (PMMA). However, other types of materials may be substituted, but preferably materials that may be spun on and subsequently cured into a solid. Moreover, in one embodiment, the second polymer layer 501 has an index of refraction that is higher than the polymer layer 301. While not necessary to address the cracking issue, by having the second polymer layer 501 have a higher index of refraction, this will further add in lowering the amount of cross-talk between adjacent pixels, as will as improve the amount of light incident on the pixels. This can be seen in FIG. 6.

Figure 6:
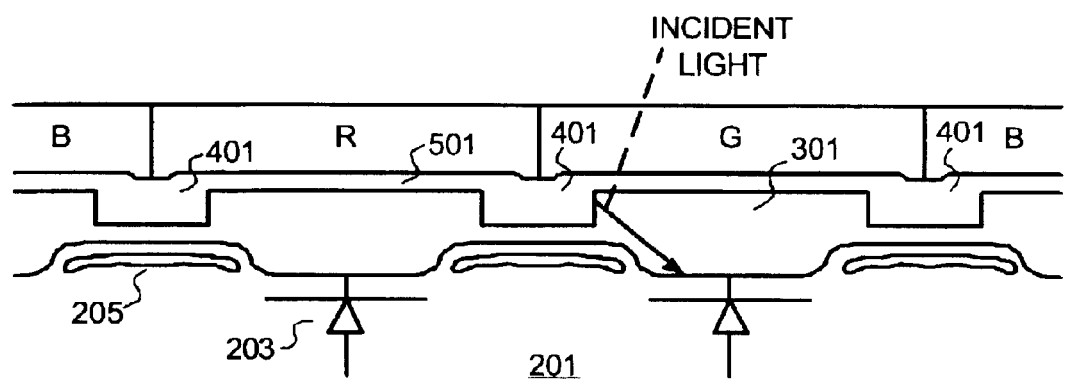

The polymer layer 301 and second polymer layer 501 form a base upon which the color filter layers can be formed. Thus, after the second polymer layer 501 is formed, the color filter layers can be formed using any number of conventional methods noted in the patents cited above. The result is seen in FIG. 6.

The above method and structure will reduce stress in the image sensor. Further, the structure will increase light gathering efficiency and reduce cross-talk.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method of forming a base for a color filter layer of an image sensor that includes an array of pixels formed in a substrate, the method comprising:

depositing a polymer layer over said substrate;

patterning said polymer layer to form gaps in said polymer layer, said gaps located between the pixels; and depositing a second polymer layer into said gaps.

2. The method of claim 1 wherein said gaps do not extend through the entire thickness of said polymer layer.

3. The method of claim 1 further including forming a color filter layer over said second polymer layer.

4. The method of claim 1 wherein said second polymer layer has an index of refraction higher than said polymer layer.

5. The method of claim 1 wherein said polymer layer is polyglycidylmethylacrylate (PGMA).

6. The method of claim 5 wherein said second polymer layer is an organic polyimide.

7. The method of claim 1 wherein said second polymer layer is deposited over said polymer layer.

8. The method of claim 1 wherein said gaps form a trench around discrete islands of said polymer layer, said discrete islands formed over the pixels.

9. A base for a color filter layer of an image sensor that includes an array of pixels formed in a substrate, the base comprising:

a polymer layer formed over said substrate, gaps in said polymer layer, said gaps located between the pixels; and a second polymer layer formed into said gaps.

10. The base of claim 9 wherein said gaps do not extend through the entire thickness of said polymer layer.

11. The base of claim 9 further including forming a color filter layer over said second polymer layer.

12. The base of claim 9 wherein said second polymer layer has an index of refraction higher than said polymer layer.

13. The base of claim 9 wherein said polymer layer is polyglycidylmethylacrylate (PGMA).

14. The base of claim 13 wherein said second polymer layer is an organic polyimide.

15. The base of claim 9 wherein said second polymer layer is deposited over said polymer layer.

16. The base of claim 9 wherein said gaps form a trench around discrete islands of said polymer layer, said discrete islands formed over the pixels.

* * * * *